United States Patent [19]
Vahala et al.

[11] Patent Number: 5,199,038
[45] Date of Patent: Mar. 30, 1993

[54] SEMICONDUCTOR LASER NOISE REDUCTION

[76] Inventors: Kerry J. Vahala, 328 Bridge St., San Gabriel, Calif. 91775; Michael A. Newkirk, 707 Rockwood Rd., Pasadena, Calif. 91105

[21] Appl. No.: 699,518

[22] Filed: May 14, 1991

Related U.S. Application Data

[63] Continuation-in-part of Ser. No. 594,376, Oct. 9, 1990, abandoned.

[51] Int. Cl.$^5$ .................................................. H01S 3/00
[52] U.S. Cl. .......................................... 372/33; 372/20; 372/29; 372/18
[58] Field of Search ...................... 372/33, 92, 18–20, 372/97

[56] References Cited
U.S. PATENT DOCUMENTS
4,464,759 8/1984 Haus et al. ............................ 372/20

Primary Examiner—Leon Scott, Jr.

[57] ABSTRACT

Amplitude or intensity noise in the output of a laser in detuned operation is reduced by application of a frequency dependent transfer function which exploits amplitude-phase coupled noise described by the linewidth enhancement parameter $\alpha$ by applying an inverse of a replica of the amplitude noise recovered from the phase noise to the laser output. The noise canceling amplitude is applied to the laser output by a filter whose frequency dependent transfer function is related to the inverse of the amplitude-phase noise transfer function of the laser producing the output. The appropriate transfer function may be selected and/or adjusted in response to the magnitude of the amplitude noise. The intensity noise may be reduced by the factor $1/(1+\alpha^2)$ which may squeeze the intensity noise below normal quantum limits.

19 Claims, 1 Drawing Sheet

SEMICONDUCTOR LASER NOISE REDUCTION

This application is a continuation-in-part of U.S. patent application Ser. No. 07/594,376 filed Oct. 9, 1990, now abandoned.

BACKGROUND OF THE INVENTION

1. Field of the Invention

This invention relates to lasers and, in particular, to the reduction of amplitude and therefore intensity noise in light from lasers, such as semiconductor lasers, configured for detuned operation.

2. Description of the Prior Art

All laser light typically includes both amplitude and phase noise. Phase noise contributes to a finite output spectral linewidth. Amplitude noise limits the performance of lasers in communication systems and other applications.

Amplitude and phase noise in detuned lasers are known to be related. The linewidth enhancement parameter $\alpha$ has been well studied and provides a measure of the amplitude and phase coupling in lasers resulting from detuned operation, that is, when the linewidth enhancement parameter $\alpha$ is not equal to zero. It is conventionally believed that semiconductor lasers inherently operated in a detuned fashion.

Linewidth enhancement for semiconductor lasers is known to result at least in part from amplitude fluctuations in the resonant cavity which cause small transient perturbations to the active layer carrier density. Such amplitude fluctuations are known to cause amplitude as well as excess phase noise, that is, linewidth enhancement. The phase noise is a jittering of the instantaneous frequency of the laser resulting from the perturbation in carrier density caused by the amplitude fluctuations because the laser frequency is dependent upon the effective refractive index which is, itself, carrier density dependent.

SUMMARY OF THE INVENTION

The preceding and other shortcomings of the prior art are addressed and overcome by the present invention that provides a method of reducing amplitude noise in the output of a laser by selecting a device having a frequency dependent transfer function related to the amplitude-phase noise coupling in a detuned laser, and applying said device to the laser output to cancel a portion of the amplitude noise therein.

In another aspect, the invention provides a method of producing laser output by producing laser output in which phase noise is coupled to phase noise, and reducing amplitude noise in said laser output in response to phase noise therein.

In a further aspect, the invention provides a laser system with means for providing laser output in which amplitude noise is coupled to phase noise, and means for reducing amplitude noise in said laser output in response to phase noise therein.

These and other features and advantages of this invention will become further apparent from the detailed description that follows which is accompanied by one or more drawing figures. In the figures and description, numerals indicate the various features of the invention, like numerals referring to like features throughout both the drawing figures and the description.

BRIEF DESCRIPTION OF THE DRAWING(S)

FIG. 1 is a graphical representation of the amplitude and phase biuse of laser output 10.

FIG. 2 is a graphical representation of transfer functions 21 and 22 in a region about the lasing frequency of amplitude noise reduction filter 12 shown in FIG. 4, below.

FIG. 3 is a graphical representation of filtered output 14 resulting from the operation of amplitude noise reduction filter 12 on laser output 10.

FIG. 4 is a schematic illustration of amplitude noise reduction system 16 according to the present invention.

DETAILED DESCRIPTION OF THE PREFERRED EMBODIMENT(S)

Figure 1:
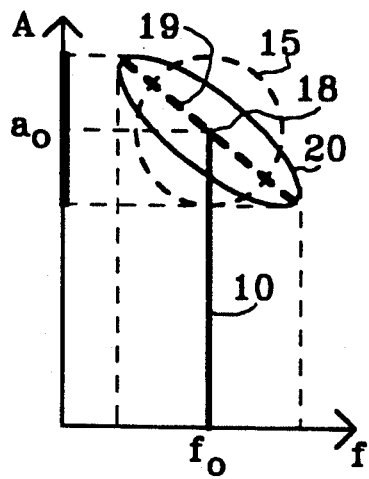

FIG. 1 is a graphical representation of the amplitude and phase noise of laser output 10. In the absence of amplitude and phase noise, laser output 10 could be represented as a single vertical line the top of which would indicate amplitude $a_0$ and instantaneous frequency $f_0$ when displayed as a function of amplitude and instantaneous frequency.

Phase noise results in changes of the instantaneous frequency of laser output 10 about $f_0$ with time while amplitude noise results in changes of the amplitude of laser output 10 about $a_0$ with time. Laser output 10 could therefore be anywhere within a certain range of amplitudes and frequencies surrounding $a_0$ and $f_0$ at any particular time.

If laser output 10 were generated by a laser in tuned operation, the root mean square deviation of the amplitude and instantaneous frequency of laser output 10 would be within dotted circle 15 having a fixed radius surrounding point 18. The detuned operation of a semiconductor laser results in coupled amplitude and phase noise so that the root mean square deviation of the amplitude and instantaneous frequency of laser output 10 would be within ellipse 20 at any instant of time.

The major axis of ellipse 20 is tilted with respect to the coordinate axes. This tilt is indicative of the coupling between amplitude and phase noise in laser output 10 and is shown as amplitude-phase coupled noise transfer function 21 in FIG. 2. As noted above, linewidth enhancement parameter $\alpha$ is a measure of this coupling.

In accordance with the present invention, this coupling is exploited to reduce the amplitude noise present in laser output 10 by appropriate processing. A replica of the amplitude noise in laser output 10 appears as phase noise in laser output 10. This replica of the amplitude noise in the phase noise includes substantial information about the time varying magnitude of the amplitude noise also present in that output. An inverted version of this replica of the amplitude noise is used to cancel some of the amplitude noise in laser output 10.

In the preferred embodiment described herein, laser output 10 is processed by amplitude noise reduction filter 12, a device whose amplitude transfer function varies with frequency in the appropriate manner to convert phase noise in laser output 10 into recovered amplitude noise having the opposite sign from the unprocessed amplitude noise in laser output 10. This recovered amplitude noise is applied to laser output 10 by amplitude noise reduction filter 12 to cancel at least a portion of such unprocessed amplitude noise.

A conventional frequency discriminator is an example of a device having a frequency dependent amplitude transfer function. An adjustable optical interferometer is a convenient device for providing an appropriate transfer function because adjustment of the interferometer may be used to adjust the slope of filter transfer function 22 to the proper value, related to noise transfer function 21, to maximize the cancellation of amplitude noise.

In the preferred embodiment described below with regard to FIG. 4, a Michelson interferometer is used as an adjustable amplitude noise reduction filter 12 to provide the appropriate frequency dependent transfer function 22. Other devices whose frequency dependent filter transfer functions are adjustable, including other optical interferometers whose interferometer slopes are adjustable in the range of the inverse of the source noise transfer function, may be used to select and provide appropriate filter transfer functions for noise cancellation in laser outputs whose noise transfer function is partially or wholly unknown while devices with appropriate fixed filter transfer functions may be used for noise cancellation in laser outputs by empirical selection and/or where the noise transfer function is at least partially unknown.

Figure 2:
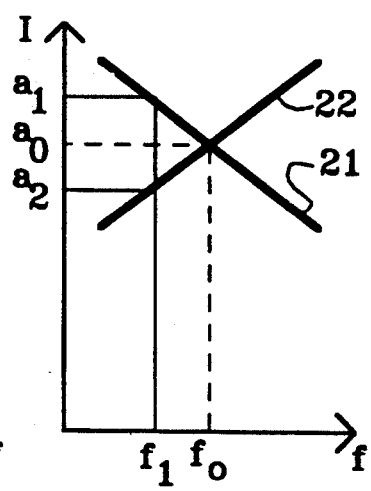

FIG. 2 is a graph of the portion of filter transfer function 22 near the lasing frequency, as a function of frequency. As shown in the figure, the amplitude of transfer function 22 changes in a predictable manner with respect to frequency. In particular, the slope of transfer function 22 is related to the inverse of the slope of effective noise transfer function 21. Filter transfer function 22 crosses noise transfer function 21 at $f_0$, the center frequency of laser output 10.

Figure 4:
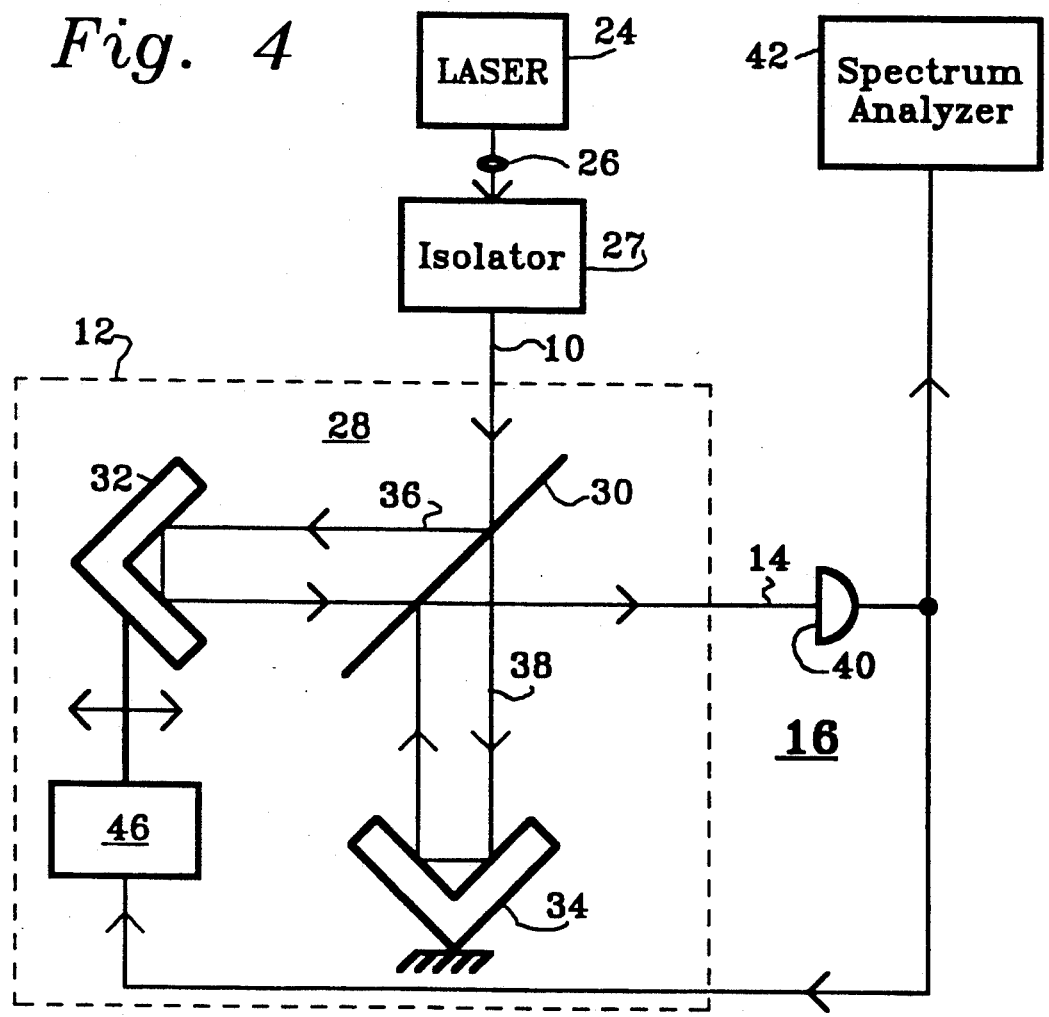

Transfer function 22 is applied by amplitude noise reduction filter 12, shown in FIG. 4, to laser output 10 to produce filtered output 14. Transfer function 22 is selected to at least partially decouple the phase and amplitude noise in laser output 10 by converting the portion of the phase noise that correlates with amplitude noise into an inverted replica of a portion of the amplitude noise.

As noted above, amplitude and phase noise are coupled and may be related by linewidth enhancement parameter $\alpha$. Since the amount of coupling is known, some of the phase fluctuations or noise in laser output 10 are a reflection of the amplitude fluctuations or noise in laser 24. This reflection of the amplitude noise in the phase noise is a model of at least a portion of the amplitude noise and is subtracted from the amplitude noise to substantially reduce the total amplitude noise Transfer function 22 is selected to convert the phase noise in laser output 10 into amplitude noise that is an inverted replica of the amplitude noise caused by the amplitude fluctuations or other perturbations that created the phase noise. This is accomplished by coupling the magnitude of transfer function 22 to the instantaneous frequency of its input in the inverse of the manner in which the phase noise is coupled to amplitude noise by noise transfer function 21.

For example, as the phase noise causes laser output 10 to increase slightly in instantaneous frequency, the magnitude of transfer function 21 for that slightly higher frequency is lower, slightly reducing the amplitude of laser output 10. Similarly, as the phase noise slightly decreases the instantaneous frequency of laser output 10, the magnitude of transfer function 21 is higher, slightly increasing the amplitude of laser output 10.

The slight changes in amplitude of laser output 10 caused by the frequency dependent nature of transfer function 22 are used to cancel the portion of the total amplitude noise which correlates with the phase noise. In this way, the amplitude noise of laser output 10 may be substantially reduced by processing of the output through a passive device having the appropriate transfer function 22.

In particular, as phase noise causes a slight decrease in the instantaneous frequency of laser output 10 from $f_0$ to $f_1$, noise transfer function 21 which couples amplitude and phase noise in laser output 10 causes amplitude noise resulting in laser output 10, increasing the amplitude from $a_0$ to $a_1$. However, in accordance with the present invention, amplitude noise reduction filter 12 applies filter transfer function 22 to laser output 10 which is selected to have the opposite effect upon the amplitude than noise transfer function 21.

For example, if noise transfer function 21 were not present, transfer function 22 would have reduced the amplitude from $a_0$ to $a_2$. Because transfer function 22 is applied to laser output 10 after the undesired noise transfer function 21 is operable, the effects of these transfer functions tend to cancel each other so that the resultant amplitude at $f_1$ is much closer to $a_0$, the desired noise free amplitude at $f_0$.

Figure 3:
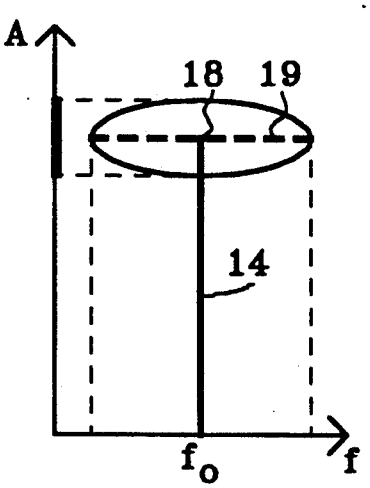

FIG. 3 is a graphical representation of the amplitude and phase noise of filtered output 14, the result of processing laser output 10 through a device such as amplitude noise reduction filter 12, having the appropriate transfer function 22. As shown in the figure, ellipse 20 has been rotated about point 18 as a result of transfer function 22 so that major axis 19 of ellipse 20 is parallel with the abscissa. This is a graphical representation of the decoupling or decorrelation of the amplitude noise from the phase noise.

The total range of amplitude noise may be represented by the projection of ellipse 20 on the ordinate of the graph. As can be clearly seen from a comparison of FIG. 3 with FIG. 1, the projection of ellipse 20 on the ordinate is substantially reduced when the portion of the amplitude noise that correlates with the phase noise is removed. The total range of phase noise may not be substantially changed by this processing.

Referring now to FIG. 4, amplitude noise reduction system 16 includes distributed feedback, or DFB, laser 24 which may be a single-mode laser source such as an InGaAsP distributed feedback laser operating at 1.3 $\mu$m. Output 10 of laser 24 may be collimated by antireflection coated lens 26 and then sent through optical isolator 27 to prevent feedback from influencing the laser.

Laser output 10, after collimation and isolation, is then applied to amplitude noise reduction filter 12. Amplitude noise reduction filter 12 may be any active or passive device having the appropriate transfer function 22. In the preferred embodiment being described, a Michelson interferometer is used to provide transfer function 22. In amplitude noise reduction filter 12 as shown in FIG. 4, Michelson interferometer 28 includes beam splitter 30 and Michelson mirror arms 32 and 34.

Laser output 10 is applied to amplitude noise reduction filter 12 so as to strike beam splitter 30 and be split into beams 36 and 38 which are reflected by Michelson mirror arms 32 and 34, respectively. In accordance with the construction of a conventional Michelson interferometer, beams 36 and 38 are then recombined on the surface of beam splitter 30 to form filtered output 14.

If Michelson mirror arms 32 and 34 were positioned at exactly the same distance from beam splitter 30, the interferometer would be said to be balanced and beams 36 and 38 would travel optical paths of the same length. The transfer function of a Michelson interferometer in a balanced configuration is frequency independent. That is, the amplitude of the output is a constant function of the frequency of the input.

In order to provide the appropriate frequency dependent transfer function 22, Michelson interferometer 28 must be operated in a slightly unbalanced mode in which the optical path length difference is on the order of 1 mm. as will be described below in greater detail.

After filtered output 14 is produced by operation of amplitude noise reduction filter 12 on laser output 10, filtered output 14 may be applied to detector 40 or any other required target for the laser output. Detector 40 may conveniently be a high quantum efficiency InGaAs p-i-n detector. Detector 40 may be connected to microwave spectrum analyzer 42 to determine the effectiveness of the amplitude noise reduction.

For the purposes of this description, Michelson mirror arm 34 may be considered to be fixed in position with regard to beam splitter 30 so that beam 38 has a fixed path length. Michelson mirror arm 32 is movable to adjust the path length of beam 36 and thereby select a filter transfer function 22 having a slope appropriate to cancel a portion of the amplitude noise in laser output 10. It may be convenient to control the coarse positioning of Michelson mirror arm 32 with a micrometer, not shown, and provide submicron positioning with piezoelectric transducer 46, to minimize amplitude noise. The appropriate transfer function 22 may therefore be selected and/or continuously adjusted to maximize noise cancellation.

In the configuration shown in FIG. 4, transfer function 22 is provided by the interferometer slope of Michelson interferometer 28 measured at the laser frequency. The dependence of amplitude noise on transfer function 22 may be demonstrated by measuring the intensity noise at a given frequency and bandwidth in microwave spectrum analyzer 42. The slope of transfer function 22 is a function of the difference in optical path length between beams 36 and 38.

For maximum transmission in a lossless interferometer at balance, not shown, at optical path length differences equal to multiples of one wavelength, the slope of the transfer function would be zero. In such a configuration, the magnitude of the amplitude noise in filtered output 14 would then be the same as the magnitude of the intrinsic amplitude noise in laser output 10.

In accordance with the embodiment of the invention shown in FIG. 4, the magnitude of the amplitude noise varies in accordance with changes in the position of Michelson mirror arm 32 and therefore with changes in the slope of transfer function 22. At plus or minus one quarter wavelength difference in optical path length from balance, the slope of transfer function 22 will be at a maximum or minimum. At plus or minus one quarter wavelength difference in optical path length from multiples of one half wavelength difference in optical path length from balance, transfer function 22 will be at maximums or minimums greater in magnitude than such maximums or minimums at lesser multiples of one half wavelength difference in optical path length from balance.

The appropriate slope for transfer function 22 to minimize amplitude noise in filtered output 14 below the intrinsic level in input laser output 10 is selected by properly positioning Michelson mirror arm 32 to minimize amplitude noise as indicated, for example, by microwave spectrum analyzer 42.

As noted above, not all phase noise inherent in laser output 10 is due to coupling of the amplitude noise in laser output 10. Under optimal conditions, intensity noise may be reduced by the factor $1/(1+\alpha^2)$. Power independent components of phase noise may further limit the total amplitude noise reduction possible with this technique.

As shown above, amplitude or intensity noise in the output of a laser in detuned operation is reduced by application of a frequency dependent transfer function which exploits amplitude-phase coupled noise described by the linewidth enhancement parameter $\alpha$ by applying an inverse of a replica of the amplitude noise recovered from the phase noise to the laser output The intensity noise may be reduced by the factor $1/(1+\alpha^2)$ which may squeeze the intensity noise below normal quantum limits.

While this invention has been described with reference to its presently preferred embodiments, its scope is not limited thereto. Rather, such scope is only limited in so far as defined by the following set of claims and includes all equivalents thereof.

What is claimed is:

1. A laser system for producing reduced amplitude noise output, comprising:
    a detuned laser for providing detuned laser output, said detuned laser output having amplitude noise and phase noise, said amplitude noise being related to said phase noise by an inherent amplitude-phase coupled noise transfer function;
    filter means for producing a filter output in response to a filter input, amplitudes of said filter input and said filter output being related to each other by a frequency dependent amplitude transfer function substantially inversely related to said inherent amplitude-phase coupled noise transfer function; and
    means for coupling said detuned laser output to said filter input,
    whereby phase noise in said detuned laser output is used to reduce amplitude noise in said filter output.

2. The laser system claimed in claim 1, wherein said detuned laser further comprises:
    a detuned semiconductor laser.

3. The laser system claimed in claim 1, wherein said filter means further comprises:
    means for canceling a portion of said amplitude noise in said detuned laser output by converting a portion of said phase noise into an inverted replica of the portion of said amplitude noise related thereto by said amplitude-phase coupled noise transfer function.

4. The laser system claimed in claim 3, further comprising:
    means for adjusting said frequency dependent amplitude transfer function.

5. The laser system claimed in claim 3, wherein said filter means further comprises:
    an interferometer having said frequency dependent amplitude transfer function; and
    means for adjusting the interferometer transfer function to control the portion of said amplitude noise being canceled.

6. The laser system claimed in claim 5, wherein said means for adjusting the interferometer transfer function further comprises:

means for determining the amplitude noise in the output of said interferometer; and means responsive to said means for determining amplitude noise for adjusting the interferometer transfer function to reduce said amplitude noise.

7. The laser system claimed in claim 5, wherein said interferometer further comprises:

an unbalanced Michelson interferometer.

8. The laser system claimed in claim 6, wherein said means for adjusting the interferometer transfer function further comprises:

means for detecting amplitude noise in the output of the Michelson interferometer;

means responsive to the amplitude noise in said detected output; and means response to said detected amplitude noise for changing the optical path length difference in said unbalanced Michelson interferometer.

9. A method of producing laser output, comprising:

providing detuned laser output having amplitude noise and phase noise, a portion of said phase noise being related to a portion of said amplitude noise by an amplitude-phase coupled noise transfer function;

producing a reduced amplitude noise output in response to said detuned laser output with an optical device having a frequency dependent amplitude transfer function inversely related to said noise transfer function, said reduced amplitude noise output having less amplitude noise than said detuned laser output.

10. The method of producing laser output claimed in claim 9, further comprising the step of:

adjusting said frequency dependent amplitude transfer function to minimize said amplitude noise in said reduced amplitude noise output.

11. The method of producing laser output claimed in claim 9, wherein said optical device is an interferometer having a frequency dependent interferometer amplitude transfer function inversely related to said reduced amplitude noise transfer function, the method further comprising the step of:

adjusting said frequency dependent interferometer amplitude transfer function to minimize said amplitude noise in said reduced amplitude noise output.

12. The method claimed in claim 11, wherein said step of adjusting said frequency dependent interferometer amplitude transfer function further comprises the steps of:

detecting amplitude noise in said reduced amplitude noise output; and adjusting said frequency dependent interferometer amplitude transfer function in response to said detected amplitude noise to minimize said amplitude noise in said reduced amplitude noise output.

13. The method claimed in claim 12, wherein said interferometer is an unbalanced Michelson interferometer having first and second optical path lengths, and said step of adjusting said frequency dependent interferometer amplitude transfer function further comprises:

adjusting said second optical path length with respect to said first an optical path length.

14. A laser system, comprising:

detuned laser means for producing laser output having unwanted amplitude noise and phase noise, a portion of said phase noise in said laser output varying as a function of amplitude noise in said laser output; and means for receiving said laser output as an input and for producing a modified output whose amplitude is related to said input by a frequency dependent amplitude transfer function substantially inversely related to said function of amplitude noise, whereby phase noise in said laser output is used to reduce amplitude noise in said modified output.

15. The laser system claimed in claim 14, wherein said detuned laser means further comprises:

a detuned semiconductor laser.

16. The laser system claimed in claim 14, wherein said means for receiving and producing further comprises:

means for varying said amplitude of said modified output as a function of the frequency of the phase noise.

17. The laser system claimed in claim 16, wherein said means for varying said amplitude further comprises:

unbalanced interferometer means; and means for adjusting the variation of said amplitude as a function of frequency to minimize said amplitude noise.

18. The laser system claimed in claim 17, wherein said unbalanced interferometer means further comprises:

an unbalanced Michelson interferometer having a difference in optical path lengths.

19. The laser system claimed in claim 18, wherein said means for adjusting further comprises:

means response to amplitude noise in said modified output for changing the optical path length difference in said unbalanced Michelson interferometer.

* * * * *